(12) United States Patent
Kato

(10) Patent No.: US 10,790,182 B2
(45) Date of Patent: Sep. 29, 2020

(54) SUBSTRATE HOLDING MECHANISM AND SUBSTRATE PROCESSING APPARATUS USING THE SAME

(71) Applicant: TOKYO ELECTRON LIMITED, Tokyo (JP)

(72) Inventor: Hitoshi Kato, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 591 days.

(21) Appl. No.: 15/018,139

(22) Filed: Feb. 8, 2016

(65) Prior Publication Data
US 2016/0240425 A1   Aug. 18, 2016

(30) Foreign Application Priority Data

Feb. 16, 2015   (JP) .................................. 2015-027717

(51) Int. Cl.
*H01L 21/687* (2006.01)
*H01L 21/67* (2006.01)

(52) U.S. Cl.
CPC .. *H01L 21/68742* (2013.01); *H01L 21/67051* (2013.01); *H01L 21/68721* (2013.01);
(Continued)

(58) Field of Classification Search
CPC ......... H01L 21/68721; H01L 21/68728; H01L 21/67051; H01L 21/68742; H01L 21/6708; H01L 21/68792; H01L 21/68764
See application file for complete search history.

(56) References Cited

U.S. PATENT DOCUMENTS 5,040,484 A * 8/1991 Mears ............... H01L 21/68728
                                                              118/503
6,485,248 B1 * 11/2002 Taylor, Jr. ......... H01L 21/67748
                                                              414/217
(Continued)

FOREIGN PATENT DOCUMENTS

CN     101665920 A    3/2010
JP     07142556 A     6/1995
(Continued)

OTHER PUBLICATIONS

Marrs Jennifer (2012) found at: Machine Designers Reference—9.1.1 Spring Types. Industrial Press. Retrieved from https://app.knovel.com/hotlink/pdf/id:kt0097WIB1/machine-designers-reference/spring-types (Year: 2012).*

*Primary Examiner* — Monica S Carter
*Assistant Examiner* — Mahdi H Nejad
(74) *Attorney, Agent, or Firm* — Nath, Goldberg & Meyer; Jerald L. Meyer

(57) ABSTRACT

There is provided a substrate holding mechanism of holding a substrate in a predetermined substrate holding region on a susceptor, including: a substrate holding member installed around the substrate holding region and configured to be in contact with a lateral surface of the substrate mounted on the substrate holding region at a predetermined contact surface of the substrate holding member when the substrate holding member is rotated inward of the substrate holding region; a biasing part configured to apply a biasing force with respect to the substrate holding member such that the substrate holding member is brought into contact with the lateral surface of the substrate to hold the substrate; and a release member configured to apply a pressing force against the biasing force of the biasing part with respect to the substrate (Continued)

holding member such that the substrate holding member is released to vertically lift up the substrate.

14 Claims, 11 Drawing Sheets

(52) U.S. Cl.
CPC .. *H01L 21/68728* (2013.01); *H01L 21/68764* (2013.01); *H01L 21/68771* (2013.01)

(56) References Cited

U.S. PATENT DOCUMENTS

| | | | | |
|---|---|---|---|---|
| 6,761,362 | B2* | 7/2004 | Noguchi | H01L 21/67288 118/503 |
| 8,686,383 | B2* | 4/2014 | Zama | G01N 21/9501 250/559.14 |
| 2002/0153676 | A1* | 10/2002 | Noguchi | H01L 21/67288 279/106 |
| 2005/0014368 | A1* | 1/2005 | Yoshioka | C25D 17/06 438/689 |
| 2005/0211867 | A1* | 9/2005 | Margeson | H01L 21/68728 248/550 |
| 2006/0174836 | A1* | 8/2006 | Lee | H01L 21/67103 118/725 |
| 2007/0292632 | A1* | 12/2007 | Yoshida | B65G 49/061 428/1.1 |
| 2008/0289967 | A1* | 11/2008 | Owczarz | H01L 21/6723 205/157 |
| 2011/0034034 | A1* | 2/2011 | Du Bois | C23C 16/4585 438/758 |
| 2011/0048469 | A1* | 3/2011 | Ogata | B08B 3/04 134/33 |
| 2011/0159702 | A1* | 6/2011 | Ohizumi | C23C 16/45551 438/778 |
| 2012/0186744 | A1* | 7/2012 | Higashijima | H01L 21/67051 156/345.21 |
| 2012/0315113 | A1* | 12/2012 | Hiroki | B65G 49/061 414/217 |
| 2013/0334172 | A1* | 12/2013 | Matsumoto | H01L 21/67023 216/85 |
| 2014/0273523 | A1 | 9/2014 | Rathsack | |
| 2014/0373289 | A1* | 12/2014 | Miyazaki | H01L 21/67051 15/21.1 |
| 2017/0217017 | A1* | 8/2017 | Sakaue | B25J 9/163 |

FOREIGN PATENT DOCUMENTS

| | | | |
|---|---|---|---|
| JP | 2000332085 | * | 11/2000 |
| JP | 2002319613 A | | 10/2002 |
| JP | 2003258069 A | | 9/2003 |
| JP | 2007-049005 A | | 2/2007 |
| JP | 2009060063 A | * | 3/2009 |
| JP | 2011-151387 | | 8/2011 |
| JP | 2011-190519 | | 9/2011 |
| JP | 2012049245 A | | 3/2012 |
| JP | 2012222240 | * | 11/2012 |
| JP | 2014-110296 A | | 6/2014 |
| KR | 10-2005-0070972 | * | 7/2005 |
| KR | 10-2005-0070972 A | | 7/2005 |
| KR | 10-2013-0097184 A | | 9/2013 |
| TW | 201351541 A | | 12/2013 |

* cited by examiner

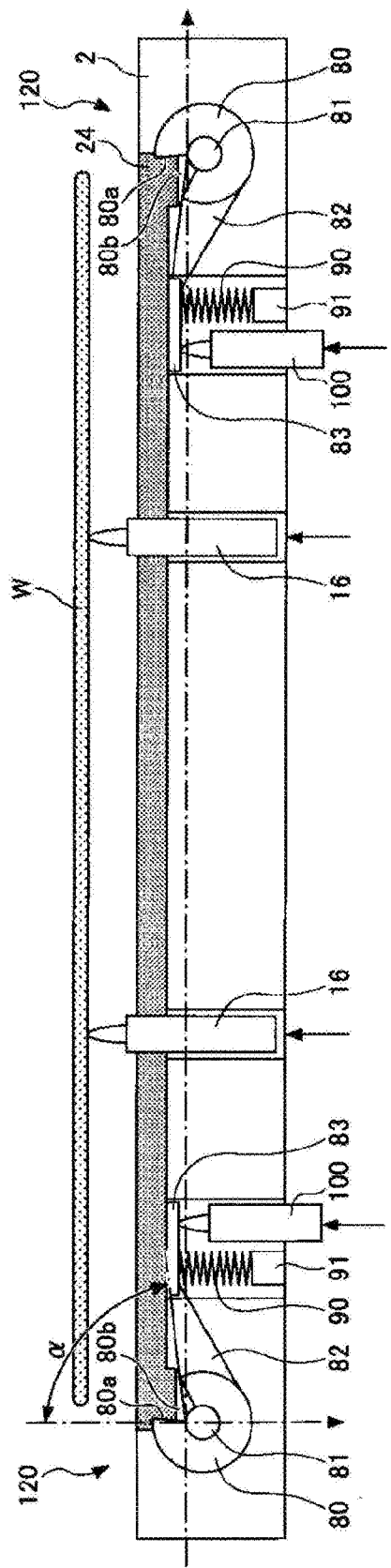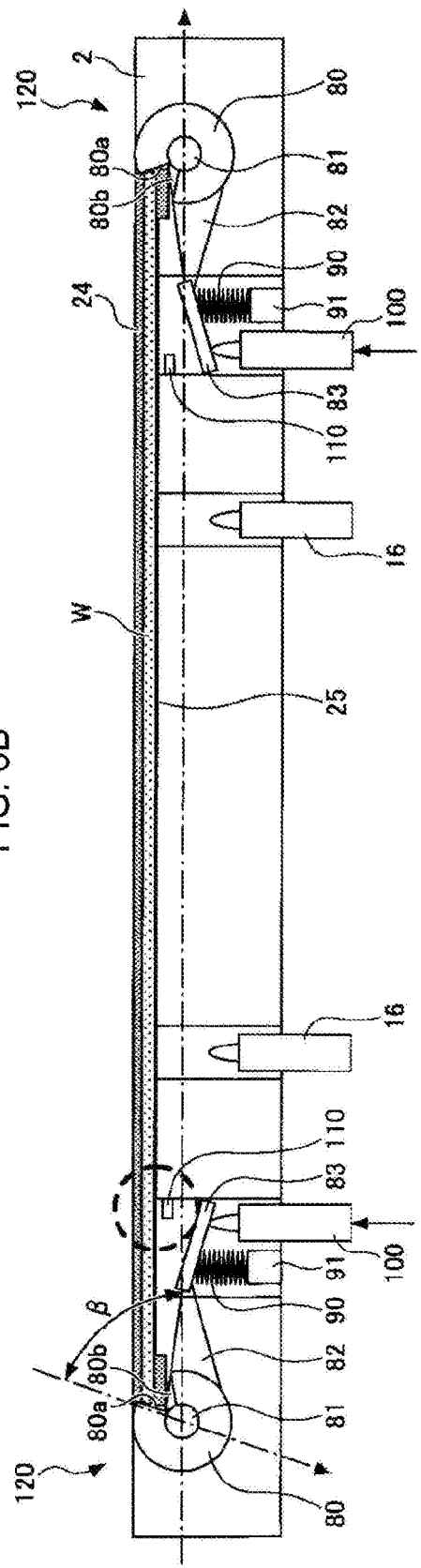

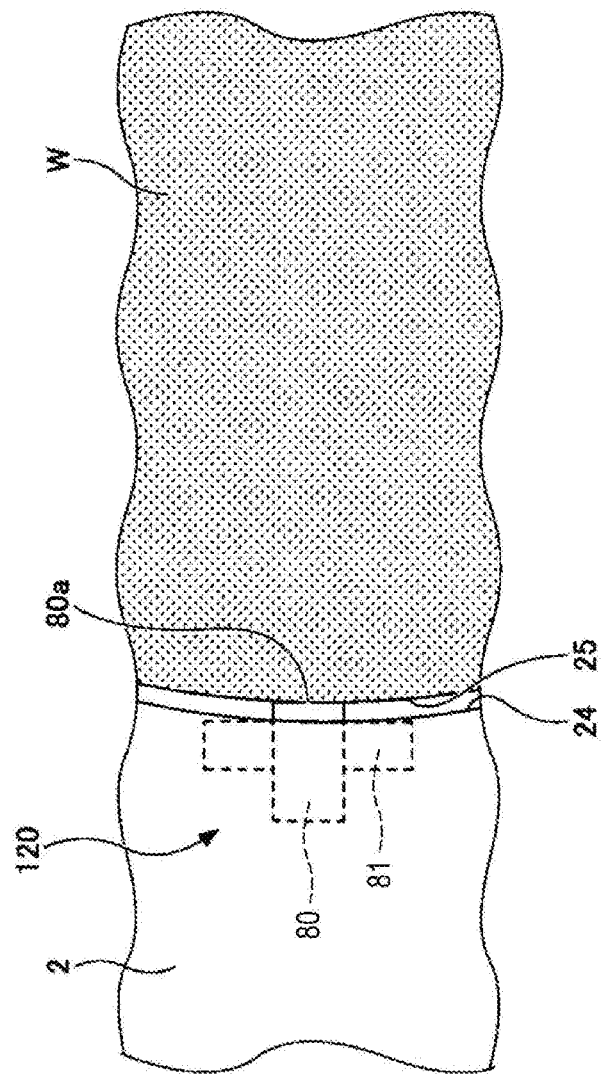

SUBSTRATE HOLDING MECHANISM AND SUBSTRATE PROCESSING APPARATUS USING THE SAME

CROSS-REFERENCE TO RELATED APPLICATION

This application claims the benefit of Japanese Patent Application No. 2015-027717, filed on Feb. 16, 2015, in the Japan Patent Office, the disclosure of which is incorporated herein in their its entirety by reference.

TECHNICAL FIELD

The present disclosure relates to a substrate holding mechanism and a substrate processing apparatus using the same.

BACKGROUND

There is known a film formation apparatus in which a plurality of substrates is mounted in a plurality of recesses circumferentially formed in a rotary table inside a vacuum container, respectively. In such a film formation apparatus, the rotary table is rotated such that the substrates sequentially pass through a region to which a process gas is supplied, thereby forming a thin film on each of the substrates. This film formation apparatus includes a ring member which is formed in a ring shape around a periphery of the substrate in a circumferential direction so as to prevent the substrate from popping out of the rotary table due to a difference in pressure between regions through which the substrate passes. The ring member is fixed to lift pins which can be moved up and down while passing through the rotary table. Once the substrate is mounted in the recess, the lift pins are moved downward such that the ring member is positioned at a position adjacent to the periphery of a surface of the substrate or slightly above the periphery. Thus, the ring member limits floating up of the substrate to prevent the substrate from popping out of the rotary table.

In addition, there is known another film formation apparatus which forms a thin film on a target object W using a raw material gas of an organometallic compound. This apparatus includes a processing container, a mounting table equipped with a heater therein, and a gas introduction means installed to face the mounting table. An annular shield ring is loosely installed in an outer side of a main body of the mounting table so that the annular shield ring can be removed, thereby preventing a film from being formed on a side wall of the main body of the mounting table as well as on a back surface of a semiconductor wafer.

In the film formation apparatus using the rotary table, when a film formation process is performed while the substrate floats up from a substrate mounting region or a substrate mounting table, the substrate is likely to pop out of the substrate mounting region or the substrate mounting table. In addition, even in a film formation apparatus not using a rotary table, an unwanted film is likely to be formed on a back surface of a substrate. As such, the conventional apparatuses employ the aforementioned configurations to prevent such problems.

However, in the film formation apparatus using the rotary table, since the ring member partially covers the periphery of the surface of the substrate, a film may be insufficiently formed on a place at which the ring member is installed, or a flow of gas supplied for the film formation process may fluctuate due to the presence of the ring member. This affects the overall film formation process.

In addition, since the film formation apparatus using the rotary table causes a problem in that the substrate pops out during the rotation of the rotary table, the configuration of the another film formation apparatus using the shield ring is difficult to be employed in the film formation apparatus using the rotary table.

SUMMARY

Some embodiments of the present disclosure provide to a substrate holding mechanism which is capable of surely preventing a substrate from floating up and holding the substrate, while exposing the entire front surface of the substrate, and a substrate processing apparatus using the same.

According to one embodiment of the present disclosure, there is provided a substrate holding mechanism of holding a substrate in a predetermined substrate holding region on a susceptor, including: a substrate holding member installed around the predetermined substrate holding region, and configured to be in contact with a lateral surface of the substrate mounted on the predetermined substrate holding region at a predetermined contact surface of the substrate holding member when the substrate holding member is rotated inward of the predetermined substrate holding region; a biasing part configured to apply a biasing force with respect to the substrate holding member such that the substrate holding member is brought into contact with the lateral surface of the substrate to hold the substrate; and a release member configured to apply a pressing force against the biasing force of the biasing part with respect to the substrate holding member such that the substrate holding member is released to lift up the substrate in a vertical direction.

According to another embodiment of the present disclosure, there is provided a substrate processing apparatus, including: the aforementioned substrate holding mechanism; a process container configured to receive a susceptor in the process container; at least three through-holes formed to pass through a substrate holding region; a plurality of lift pins installed to move up and down through the through-holes, respectively; and a transfer arm configured to transfer the substrate between the plurality of lift pins and the outside of the process container, wherein a release member is driven independently of the plurality of lift pins.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 8A and 8B are views of an example of a substrate holding mechanism according to an embodiment of the present disclosure.

FIG. 9 is a view showing a horizontal plane outline of a contact surface of a substrate holding member in the substrate holding mechanism according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, the overall configuration of a substrate processing apparatus according to an embodiment of the present disclosure, which is adapted to mount a substrate holding mechanism according to another embodiment of the present disclosure, will be described. The substrate holding mechanism and the substrate processing apparatus according to these embodiments are applicable to various substrate processing apparatuses which require holding a substrate. In this embodiment, the description will be given by way of an example in which the substrate processing apparatus is configured as a film formation apparatus.

Figure 1:
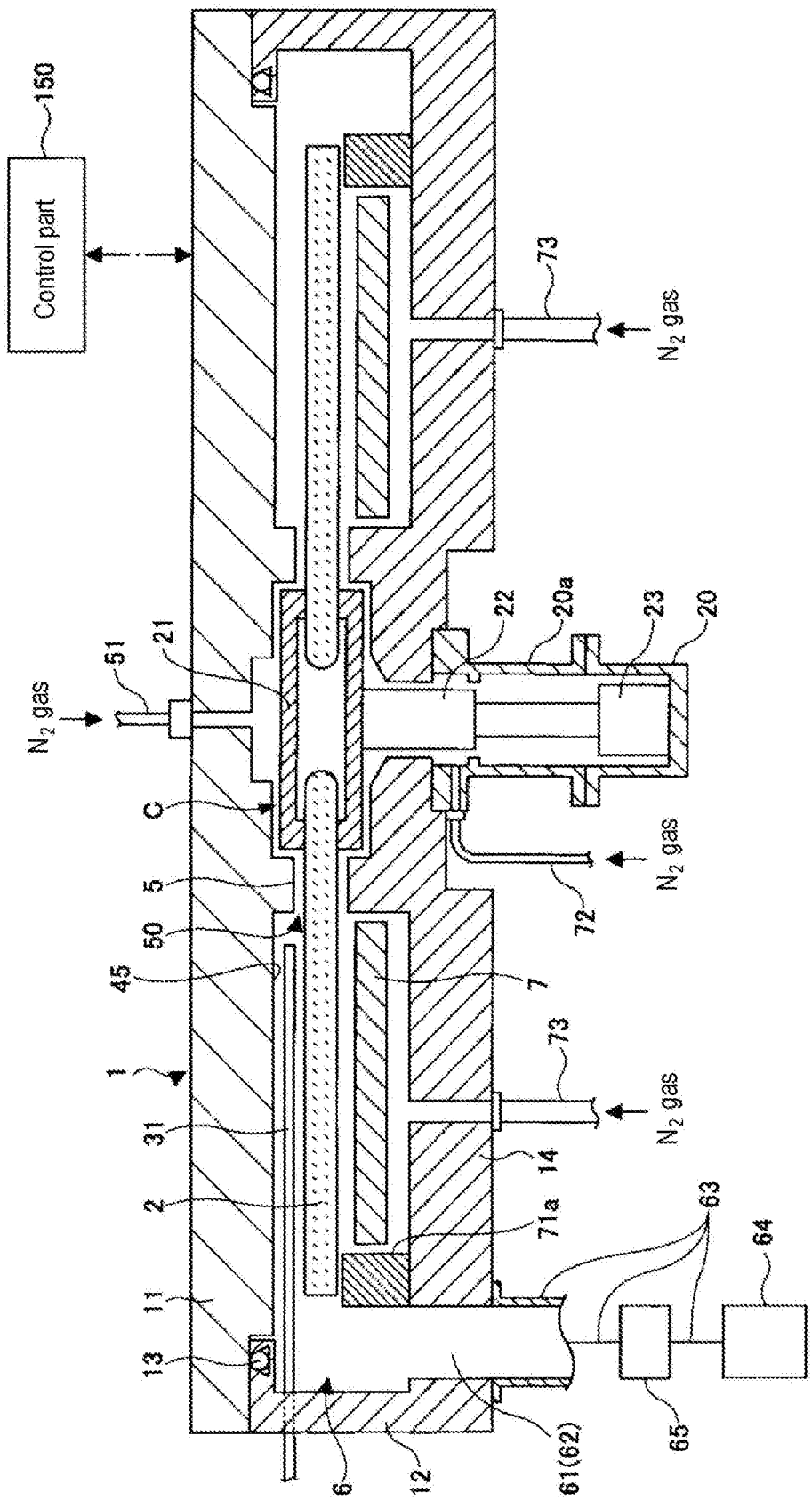
FIG. 1 is a sectional view of a substrate processing apparatus according to an embodiment of the present disclosure.
Figure 2:
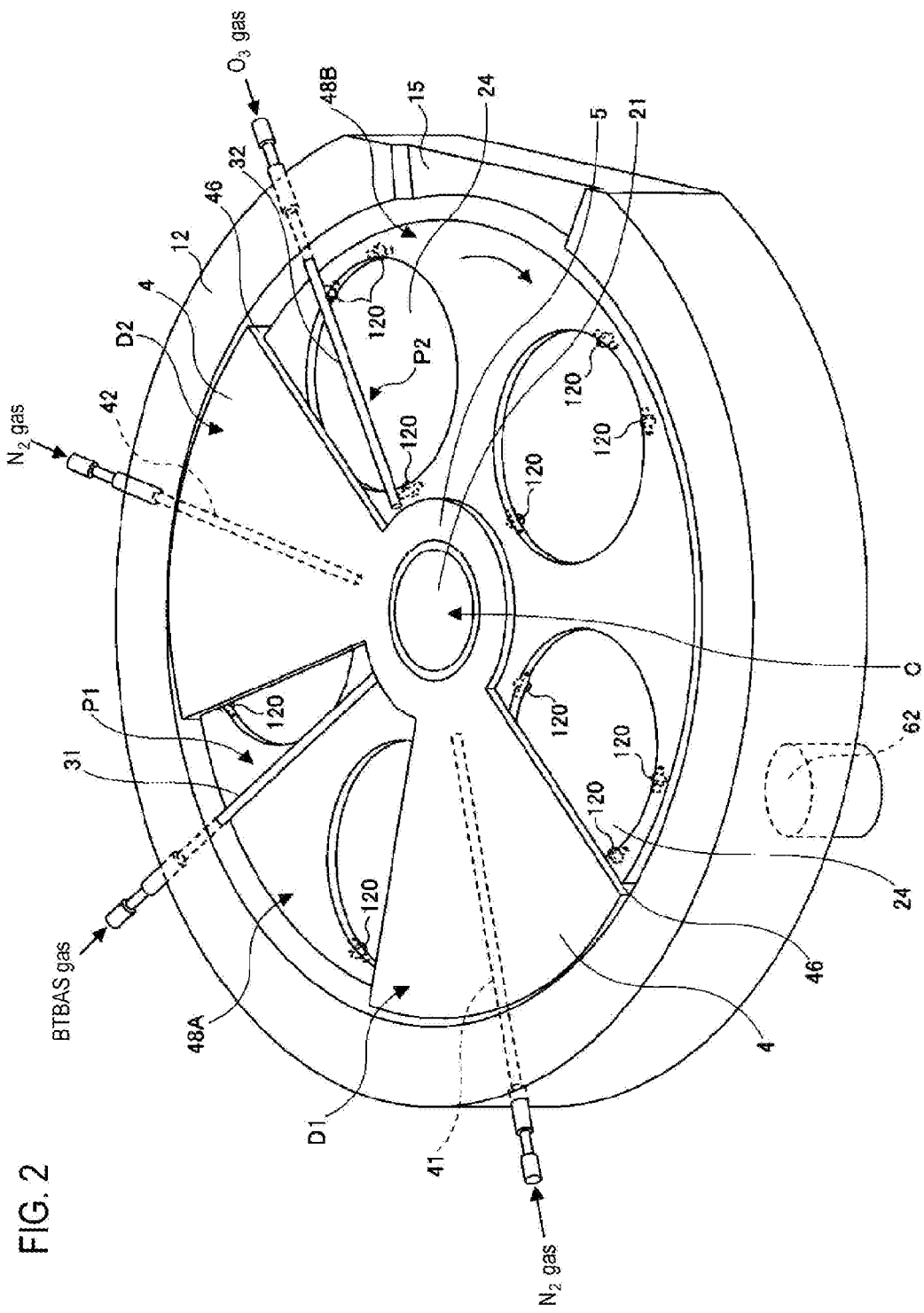
FIG. 2 is a schematic perspective view of an interior of the substrate processing apparatus of FIG. 1.

As shown in FIG. 1 (a sectional view taken along line I-I in FIG. 3) and FIG. 2, a film formation apparatus according to one embodiment of the present disclosure includes a flat vacuum container 1 having a substantially circular shape when viewed in a plane, and a rotary table 2 installed in the vacuum container 1 to have a rotational central axis at the center of the vacuum container 1. The vacuum container 1 includes a container main body 12 and a ceiling plate 11 configured to be separated therefrom. The ceiling plate 11 is attached to the container main body 12 via a sealing member 13 such as an O-ring such that the vacuum container 1 is hermetically sealed. The ceiling plate 11 and the container main body 12 may be made of, e.g., aluminum (Al). The vacuum container 1 performs a process on wafers W loaded thereinto. For this reason, the vacuum container 1 may also be referred to as a processing chamber.

Referring to FIG. 1, the rotary table 2 has a circular opening formed at the center thereof and is held by a cylindrical core part 21 which vertically clamps the periphery of the opening. The core part 21 is fixed to an upper end of a rotary shaft 22 extending in a vertical direction. The rotary shaft 22 is installed to pass through a bottom portion 14 of the container main body 12. A lower end of the rotary shaft 22 is connected to a drive part 23 configured to rotate the rotary shaft 22 about a vertical axis. With this configuration, the rotary table 2 can rotate about a central axis thereof as the rotational central axis. In addition, the rotary shaft 22 and the drive part 23 are received in a cylindrical case 20 having an opened upper side. The case 20 is hermetically connected to a lower surface of the bottom portion 14 of the vacuum container 1 via a flange portion 20a installed in an upper end of the case 20. Thus, an internal atmosphere of the case 20 is isolated from an outer atmosphere.

Figure 3:
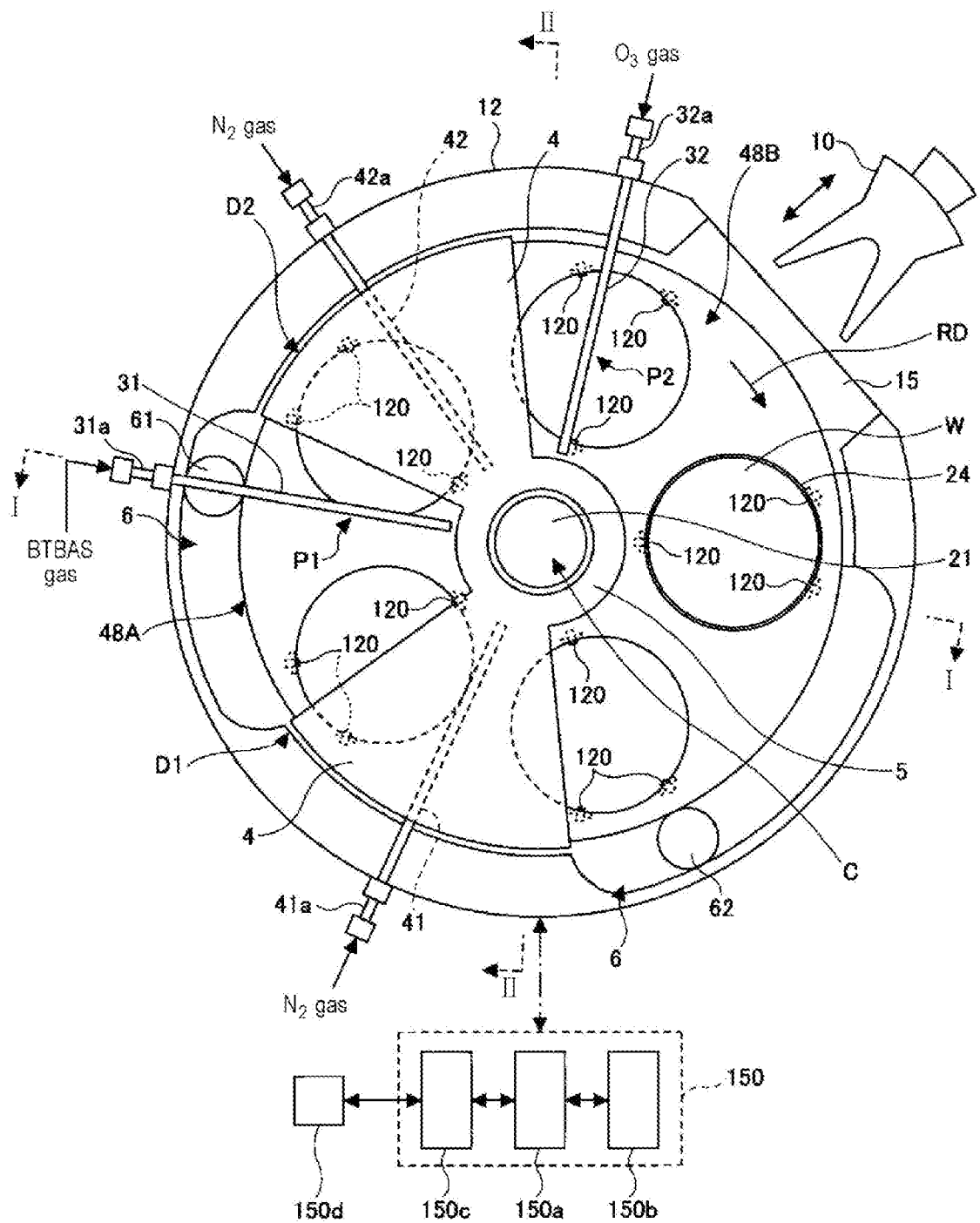
FIG. 3 is a plan view of the substrate processing apparatus of FIG. 1.

As shown in FIGS. 2 and 3, a plurality of (e.g., five) circular recess-like mounting portions 24 on which respective wafers W are mounted, is formed at equiangular intervals on an upper surface of the rotary table 2. In FIG. 3, only one sheet of wafer W is shown for the sake of simplicity.

As shown in FIGS. 2 and 3, a plurality of substrate holding mechanisms 120 is disposed around each of the mounting portions 24. The substrate holding mechanisms 120, which serve to hold the wafer W, securely hold the wafer W such that the wafer W can be prevented from popping out of the mounting portion 24 even when the rotary table 2 is rotated. The substrate holding mechanisms 120 will be described in detail below with reference to FIG. 8 and subsequent drawings.

Figure 4:
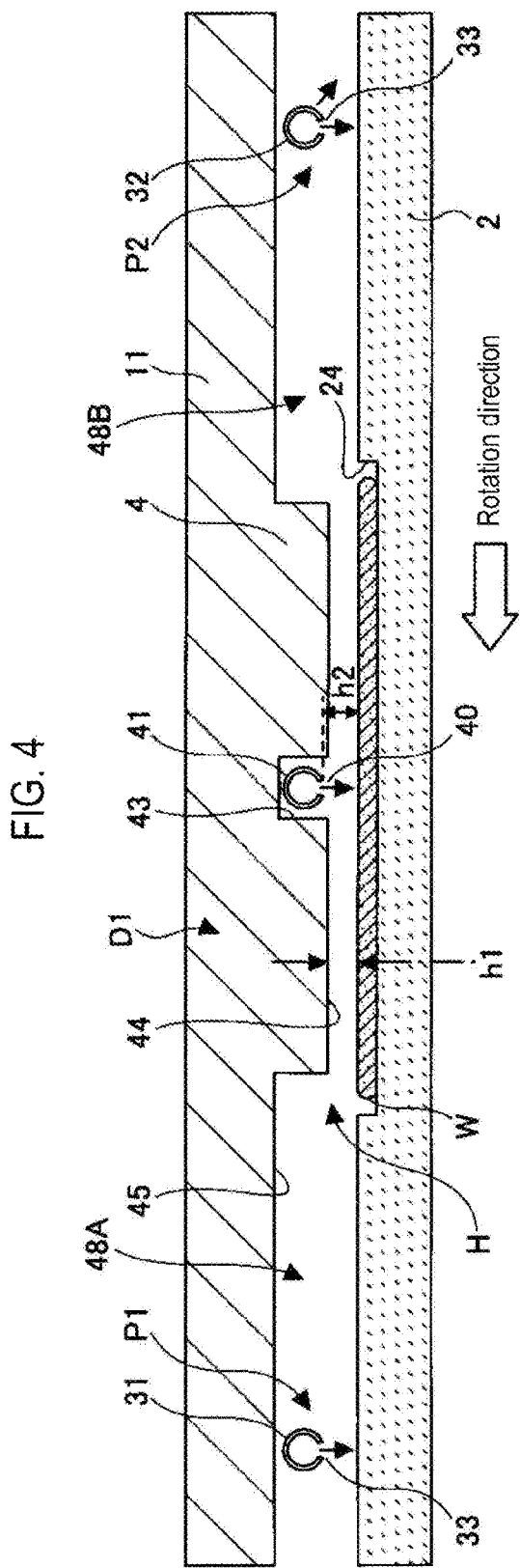
FIG. 4 is a sectional view of examples of a process region and a separation region in the substrate processing apparatus of FIG. 1.

FIG. 4 shows a sectional view of the mounting portion 24 and the wafer W mounted on the mounting portion 24. As shown in FIG. 4, the mounting portion 24 has a slightly greater diameter (for example, 4 mm) than the wafer W and has a depth equal to a thickness of the wafer W. The depth of the mounting portion 24 is substantially the same as the thickness of the wafer W. Accordingly, when the wafer W is mounted on the mounting portion 24, a front surface of the wafer W becomes substantially equal to a horizontal level of a surface of a region other than the mounting portion 24 in the rotary table 2. For example, if the surfaces of the wafer W and the region have a relatively large difference in horizontal level, a turbulent flow is generated, which affects uniformity in film thickness of the wafer W. To reduce this, the surfaces of the wafer W and the region are set to have substantially the same horizontal level. The expression "substantially the same horizontal level" used herein may mean that a difference in horizontal level between the surfaces of the wafer and the region is less than or equal to about 5 mm. In some embodiments, the difference in horizontal level may be close to zero as possible within an allowable limit of machining accuracy.

Referring to FIGS. 2 to 4, two convex portions 4 spaced apart from each other in a rotational direction (e.g., a direction indicated by an arrow RD in FIG. 3) of the rotary table 2 are formed. Although the ceiling plate 11 is omitted in FIGS. 2 and 3, the convex portions 4 are attached to a lower surface 45 of the ceiling plate 11, as shown in FIG. 4. In addition, as can be seen from FIG. 3, each of the convex portions 4 has substantially a fan shape when viewed in a plane. A vertex of the convex portion 4 is substantially positioned at the center of the vacuum container 1 and a circular arc thereof is positioned along an inner peripheral wall of the container main body 12. Further, as shown in FIG. 4, the convex portion 4 is placed such that a lower surface 44 of the convex portion 4 is spaced apart from the horizontal level of the rotary table 2 by a height h1.

In addition, referring to FIGS. 3 and 4, each of the convex portions 4 has a groove 43 radially extending to bisect the convex portion 4. The groove 43 receives a separation gas nozzle 41 (42) therein. Although in this embodiment, the groove 43 has been described to bisect the convex portion 4, the present disclosure is not limited thereto. In some embodiments, for example, the groove 43 may be formed to have a width increasing toward an upstream side of the convex portion 4 in the rotational direction of the rotary table 2. As shown in FIG. 3, the separation gas nozzle 41 (42) is installed to be introduced into the vacuum container 1 from an outer peripheral wall of the container main body 12. The separation gas nozzle 41 (42) is supported by the container main body 12 through a gas introduction port 41a (42a) as a base portion attached to the outer peripheral wall of the container main body 12.

The separation gas nozzle 41 (42) is connected to a separation gas supply source (not shown). An example of the separation gas may include an $N_2$ gas or an inert gas. The type of the separation gas is not particularly limited as long as it does not affect a film formation process. In this embodiment, the $N_2$ gas is used as the separation gas. In addition, the separation gas nozzle 41 (42) has a plurality of discharge holes 40 (see FIG. 4) through which the $N_2$ gas is discharged toward an upper surface of the rotary table 2. The discharge holes 40 are arranged at predetermined intervals in a longitudinal direction of the respective separation gas nozzle. In this embodiment, each of the discharge holes 40 has a diameter of about 0.5 mm and is formed at an interval of about 10 mm in the longitudinal direction of the separation gas nozzle 41 (42) from each other.

With this configuration, a separation region D1 defining a separation space H is formed by a combination of the separation gas nozzle 41 and the convex portion 4 corresponding thereto. Similarly, a separation region D2 defining the separation space H is formed by a combination of the separation gas nozzle 42 and the convex portion 4 corresponding thereto. In addition, at a downstream side of the separation region D1 in the rotational direction of the rotary table 2, there is defined a first region 48A (first supply region) substantially surrounded by the separation regions D1 and D2, the rotary table 2, the lower surface 45 (hereinafter, referred to as a "ceiling surface 45") of the ceiling plate 11 and the inner peripheral wall of the container main body 12. Further, at an upstream side of the separation region D1 in the rotational direction of the rotary table 2, there is defined a second region 48B (second supply region) substantially surrounded by the separation regions D1 and D2, the rotary table 2, the ceiling surface 45 and the inner peripheral wall of the container main body 12. In the separation regions D1 and D2, when the $N_2$ gas is discharged from the respective separation gas nozzles 41 and 42, the separation space H has a relatively high pressure so that the $N_2$ gas flows from the separation space H toward the first region 48A and the second region 48B. In other words, the convex portion 4 in each of the separation regions D1 and D2 guides the $N_2$ gas discharged from the respective separation gas nozzles 41 and 42 toward the first region 48A and the second region 48B.

In addition, referring to FIGS. 2 and 3, a process gas nozzle 31 is introduced into the first region 48A from the peripheral wall of the container main body 12 in a radial direction of the rotary table 2, and a process gas nozzle 32 is introduced into the second region 48B from the peripheral wall of the container main body 12 in the radial direction of the rotary table 2. Like the separation gas nozzles 41 and 42, the process gas nozzles 31 and 32 are supported by the container main body 12 through respective gas introduction ports 31a and 32a as base portions attached to the outer peripheral wall of the container main body 12. In some embodiments, the process gas nozzles 31 and 32 may be introduced at a predetermined angle in the radial direction.

Each of the process gas nozzles 31 and 32 has a plurality of discharge holes 33 formed therein, through which a process gas is discharged toward the upper surface of the rotary table 2 (a surface in which the wafer W is mounted on the mounting portion 24) (see FIG. 4). In this embodiment, the discharge holes 33, each of which has a diameter of about 0.5 mm, are arranged at an interval of about 10 mm in a longitudinal direction of each of the process gas nozzles 31 and 32.

The process gas nozzle 31 is connected to a first process gas supply source (not shown) and the process gas nozzle 32 is connected to a second process gas supply source (not shown). As the first and second process gases, various gases including a combination of gas (which will be described later) may be used. In this embodiment, an example of the first process gas may include a bis(tertiary-butylamino) silane (BTBAS) gas, and an example of the second process gas may include an ozone ($O_3$) gas. In the following description, a region under the process gas nozzle 31 is sometimes referred to as a process region P1 in which the BTBAS gas is adsorbed onto the wafer W, and a region under the process gas nozzle 32 is sometimes be referred to as a process region P2 in which the BTBAS gas adsorbed onto the wafer W reacts with (or, is oxidized by) the $O_3$ gas.

Referring to FIG. 4 again, in the separation region D1, a low flat ceiling surface 44 is formed (although not shown, the low flat ceiling surface 44 is formed even in the separation region D2). In each of the first region 48A and the second region 48B, the ceiling surface 45 higher than the ceiling surface 44 is formed. Thus, each of the first region 48A and the second region 48B has a greater volume than the separation space H in each of the separation regions D1 and D2. In addition, as will be described below, exhaust holes 61 and 62 through which the gas in the first and second regions 48A and 48B is exhausted are formed in the vacuum container 1 according to this embodiment. Through these exhaust holes 61 and 62, the first region 48A and the second region 48B can be maintained at a relatively low pressure as compared with the separation space H in the separation regions D1 and D2, respectively. As a result, since the separation space H in each of the separation regions D1 and D2 has a relatively high pressure, the BTBAS gas discharged from the process gas nozzle 31 in the first region 48A cannot flow toward the second region 48B through the separation space H, and the $O_3$ gas discharged from the process gas nozzle 32 in the second region 48B cannot flow toward the first region 48A through the separation space H. Thus, the process gases are separated from each other by the separation regions D1 and D2 so that they are not substantially mixed with each other within the vacuum container 1 in a vapor phase.

The height h1 (see FIG. 4) of the low ceiling surface 44 from the upper surface of the rotary table 2 may vary depending on an amount of the $N_2$ gas supplied from the separation gas nozzle 41(42). In some embodiments, the height may be set such that the separation space H in each of the separation regions D1 and D2 has a pressure higher than each of the first region 48A and the second region 48B. As an example, the height h1 may be set to fall within a range of, e.g., 0.5 to 10 mm, and may be set as small as possible. In some embodiments, the height h1 may be set to fall within a range of about 3.5 to 6.5 mm so as to prevent the rotary table 2 from colliding with the ceiling surface 44 due to rotational fluctuation of the rotary table 2. In addition, a height h2 (see FIG. 4) of a lower end of the separation gas nozzle 41(42) received in the groove 43 of the convex portion 4 from the upper surface of the rotary table 2 may be set to fall within a range of 0.5 to 4 mm.

According to the separation regions D1 and D2 configured as above, it is possible to further surely separate the BTBAS gas and the $O_3$ gas even when the rotary table 2 rotates at a rotational speed of, e.g., about 240 rpm.

Referring to FIGS. 1 to 3 again, an annular protrusion 5 is formed on the lower surface 45 of the ceiling plate 11 to surround the core part 21. The protrusion 5 is formed to face the rotary table 2 in a region outside the core part 21. In this embodiment, as clearly shown in FIG. 6, a height h15 of a space 50 from the upper surface of the rotary table 2 is slightly smaller than the height h1 of the space H. This is because the rotational fluctuation of the rotary table 2 is small in the vicinity of the center thereof. Specifically, the height h15 may be set to fall within a range of 1.0 to 2.0 mm. In some embodiments, the height h15 may be equal to the height h1. In some embodiments, the protrusion 5 may be integrally formed with the convex portion 4 or may be separately formed and coupled to the convex portion 4. FIGS. 2 and 3 show the interior of the vacuum container 1 from which the ceiling plate 11 is removed with the convex portion 4 left in the vacuum container 1.

Figure 5:
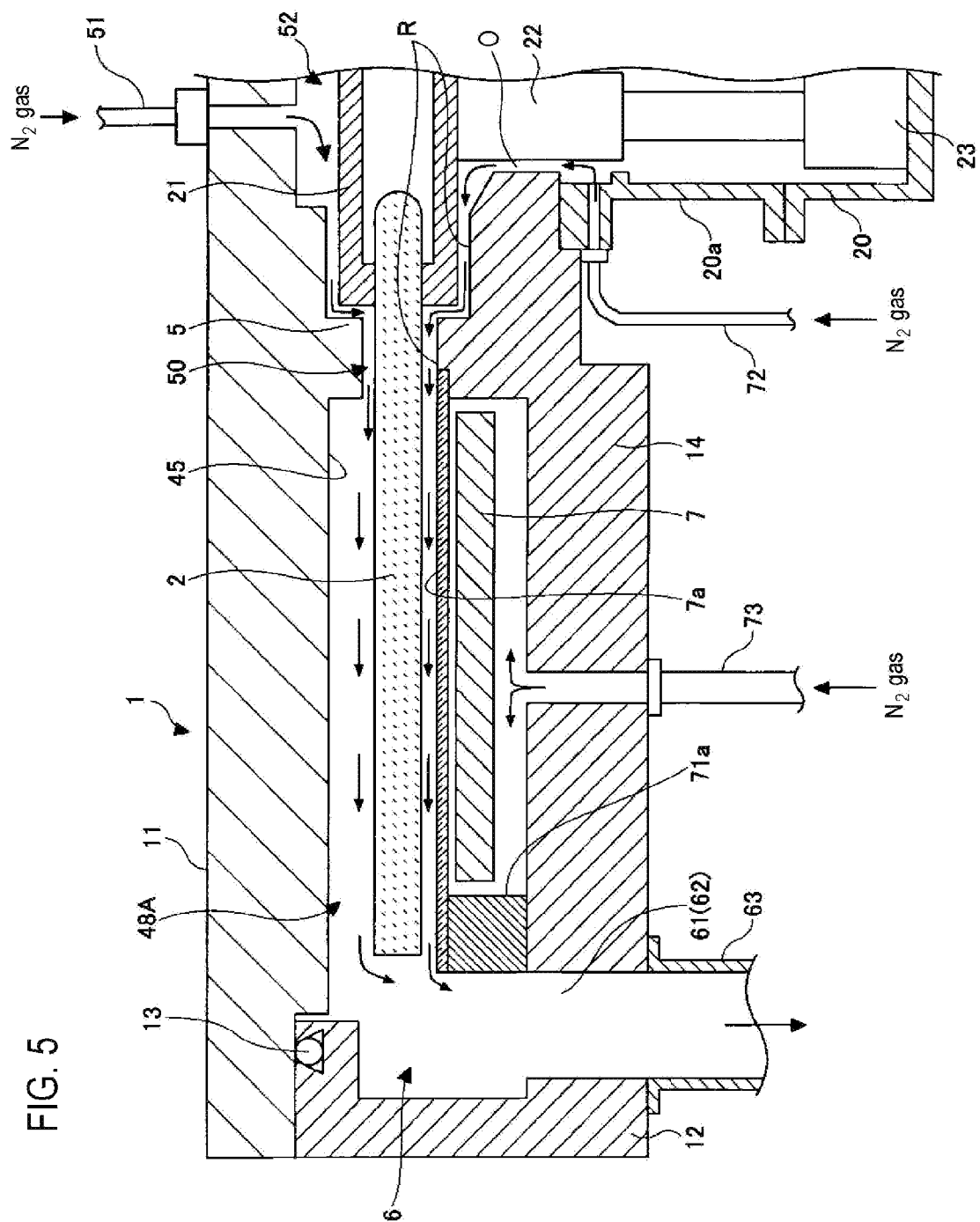
FIG. 5 is another sectional view of the film formation apparatus of FIG. 1.

FIG. 5 is an enlarged view of about a half of the film formation apparatus shown in FIG. 1. A separation gas supply pipe 51 is connected to the center of the ceiling plate 11 of the vacuum container 1 such that an $N_2$ gas is supplied into a space 52 between the ceiling plate 11 and the core part 21. By the $N_2$ gas supplied into the space 52, the space 50 having a narrow width between the protrusion 5 and the upper surface of the rotary table 2 is maintained at a relatively high pressure as compared with the first region 48A and the second region 48B. This prevents the BTBAS gas discharged from the process gas nozzle 31 in the first region 48A from flowing toward the second region 48B through the space 50 of the high pressure. In addition, the $O_3$ gas discharged from the process gas nozzle 32 in the second region 48B can be prevented from flowing toward the first region 48B through the space 50 of the high pressure. Thus, the process gases are separated from each other by the space 50 so that they are not almost mixed with each other within the vacuum container 1 in a vapor phase. That is to say, in the film formation apparatus according to this embodiment, a central region C which is defined by the rotational central portion of the rotary table 2 and the vacuum container 1 and is maintained at a pressure higher than those of the first region 48A and the second region 48B, is formed so that the BTBAS gas and the $O_3$ gas are separated from each other.

Figure 6:
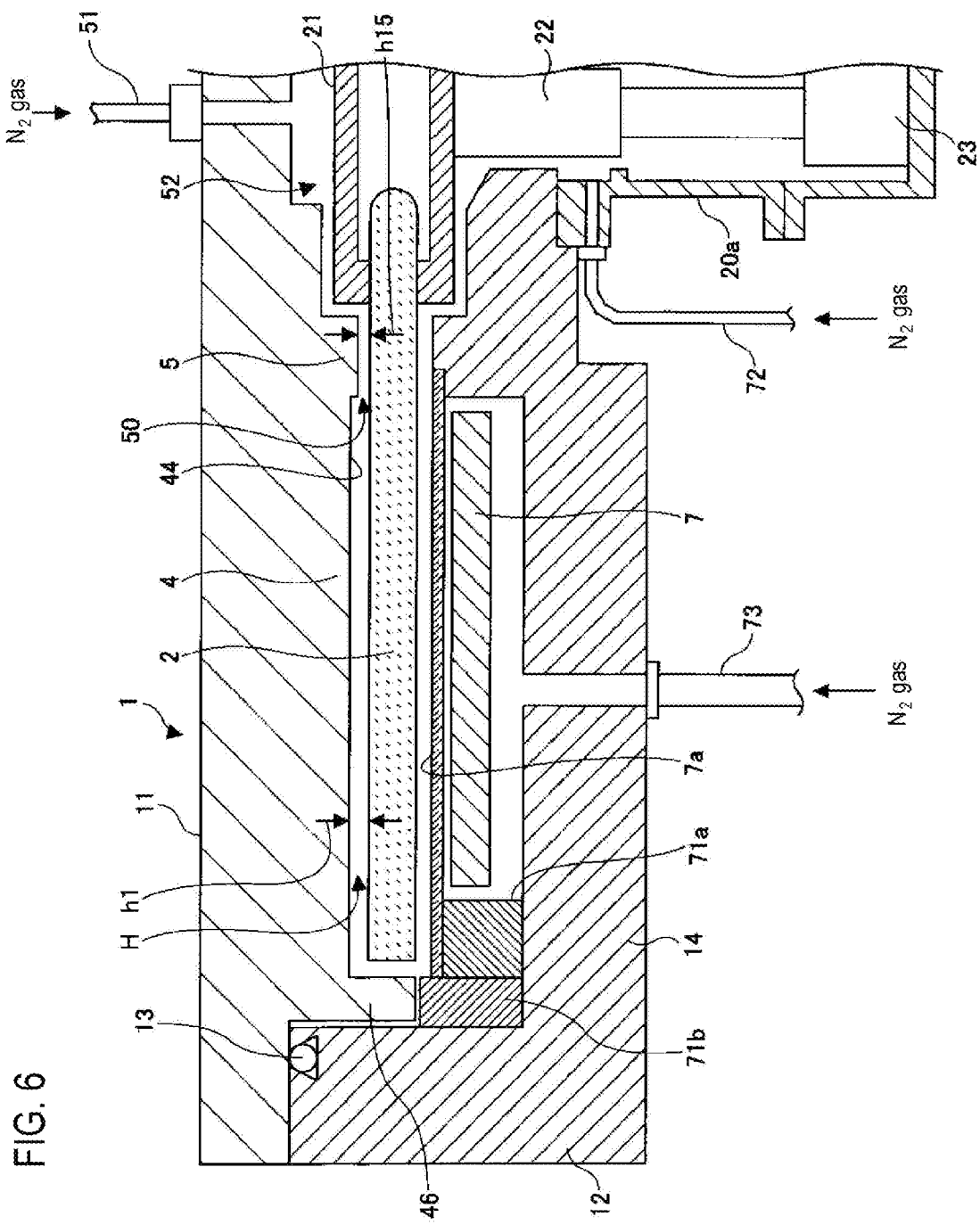
FIG. 6 is another sectional view of the film formation apparatus of FIG. 1.

FIG. 6 shows about a half of another sectional view taken along line II-II in FIG. 3. In FIG. 6, the convex portion 4 and the protrusion 5 integrally formed therewith are shown. As shown in FIG. 6, the convex portion 4 includes a bent portion 46 bent in an L-shape at an outer edge thereof. The bent portion 46 substantially fills a space between the rotary table 2 and the container main body 12, thus preventing the BTBAS gas discharged from the process gas nozzle 31 and the $O_3$ gas discharged from the process gas nozzle 32 from being mixed with each other through that space. In some embodiments, a gap between the bent portion 46 and the container main body 12 and a gap between the bent portion 46 and the rotary table 2 may be substantially equal to, for example, the height h1 of the ceiling surface 44 of the convex portion 4 from the upper surface of the rotary table 2. In addition, the bent portion 46 makes it difficult for the $N_2$ gas discharged from the separation gas nozzle 41(42) (see FIG. 3) to flow toward the outside of the rotary table 2. Thus, a flow of the $N_2$ gas from the separation regions D1 and D2 into the first region 48A and the second region 48B is promoted. In some embodiments, a block member 71b may be installed below the bent portion 46 to further prevent the separation gas from flowing under the rotary table 2.

Further, in some embodiments, the gap between the bent portion 46 and the rotary table 2 may be substantially equal to the height h1, in terms of a thermal expansion of the rotary table 2 caused when the rotary table 2 is heated by a heater unit 7 (which will be described later).

Further, in the first region 48A and the second region 48B, the inner peripheral wall of the container main body 12 is outwardly recessed as shown in FIG. 3, to form exhaust regions 6. As shown in FIGS. 3 and 5, the exhaust holes 61 and 62 are formed in bottom portions of the exhaust regions 6, respectively. The exhaust holes 61 and 62 are coupled to a common vacuum pump 64 as a vacuum-exhausting device, via an exhaust pipe 63, respectively. With this configuration, the first region 48A and the second region 48B are mainly exhausted so that they can be maintained at a lower pressure than the separation space H in each of the separation regions D1 and D2, as described above.

In addition, referring to FIG. 3, the exhaust hole 61 of the first region 48A is arranged below the process gas nozzle 31 at the outside (i.e., the exhaust region 6) of the rotary table 2. This arrangement allows the BTBAS gas discharged from the discharge holes 33 (see FIG. 4) of the process gas nozzle 31 to flow toward the exhaust hole 61 over the upper surface of the rotary table 2 in the longitudinal direction of the process gas nozzle 31. Advantages of such an arrangement will be described further below.

Referring to FIG. 1 again, a pressure regulator 65 is installed in the exhaust pipe 63 to regulate the internal pressure of the vacuum container 1. In some embodiments, a plurality of pressure regulators 65 may be installed corresponding to the respective exhaust holes 61 and 62. The formation position of each of the exhaust holes 61 and 62 is not limited to the bottom portion of the respective exhaust region 6 (the bottom portion 14 of the vacuum container 1). As an example, the exhaust holes 61 and 62 may be formed in a peripheral wall of the container main body 12 of the vacuum container 1. Alternatively, the exhaust holes 61 and 62 may be formed in the ceiling plate 11 above the exhaust region 6. However, if the exhaust holes 61 and 62 are formed in the ceiling plate 11, the gas inside the vacuum container 1 flows upward so that particles generated inside the vacuum container 1 are moved up also, thus polluting the wafer W. As such, the exhaust holes 61 and 62 are formed in the bottom portion 14 as shown in FIGS. 1, 2 and 5, or are formed in the peripheral wall of the container main body 12. In addition, if the exhaust holes 61 and 62 are formed in the bottom portion 14, the exhaust pipe 63, the pressure regulator 65 and the vacuum pump 64 can be installed below the vacuum container 1. This is advantageous in reducing a footprint of the film formation apparatus.

As shown in FIGS. 1 and 5 to 8, the annular heater unit 7 as a heating part is received in a space between the rotary table 2 and the bottom portion 14 of the container main body 12 such that the wafer W mounted on the rotary table 2 is heated to a predetermined temperature through the rotary table 2. In addition, a block member 71a is installed below the rotary table 2 and in the vicinity of the outer periphery thereof to surround the heater unit 7. Thus, the space in which the heater unit 7 is received, is partitioned from a region outside the heater unit 7 by the block member 71a. In order to prevent a gas from flowing inward of the block member 71a, the block member 71a is installed to leave a slight gap between an upper surface of the block member 71a and a lower surface of the rotary table 2. The space in which the heater unit 7 is received is connected to each of a plurality of purge gas supply pipes 73 to purge the space. Each of the purge gas supply pipes 73 is installed to pass through the bottom portion 14 of the container main body 12 at predetermined angular intervals. In addition, above the heater unit 7, a protection plate 7a configured to protect the heater unit 7 is supported by the block member 71a and a protuberance portion R (which will be described later). With this configuration, it is possible to protect the heater unit 7 even if the BTBAS gas or the $O_3$ gas is introduced into the space receiving the heater unit 7 therein. In some embodiments, the protection plate 7a may be made of, for example, quartz.

Referring to FIG. 5, the bottom portion 14 has the protuberance portion R formed inward of the annular heater unit 7. An upper surface of the protuberance portion R is close to the rotary table 2 and the core part 21. Slight gaps are left between the upper surface of the protuberance portion R and the lower surface of the rotary table 2 and between the upper surface of the protuberance portion R and a lower surface of the core part 21. In addition, the bottom portion 14 has a center hole O through which the rotary shaft 22 passes. The center hole O has an inner diameter greater than that of the rotary shaft 22 such that a gap through which the center hole O is in communication with the case 20 through the flange portion 20a is formed therein. The purge gas supply pipe 72 is connected to an upper portion of the flange portion 20a.

With this configuration, as shown in FIG. 5, the $N_2$ gas supplied from the purge gas supply pipe 72 flows into a space defined above the heater unit 7 through the gap between the rotary shaft 22 and the center hole O of the bottom portion 14, the gap between the core part 21 and the protuberance portion R of the bottom portion 14, and the gap between the protuberance portion R of the bottom portion 14 and the lower surface of the rotary table 2 in that order. In addition, the $N_2$ gas supplied from the purge gas supply pipe 73 flows into the space below the heater unit 7. These $N_2$ gas flows toward the exhaust hole 61 through the gap between the block member 71a and the lower surface of the rotary table 2. The $N_2$ gas flowing in this fashion acts as a separation gas for preventing the process gas such as the BTBAS gas (or the $O_3$ gas) from circulating through the space below the rotary table 2 to be mixed with the $O_3$ gas (or the BTBAS gas).

Figure 7:
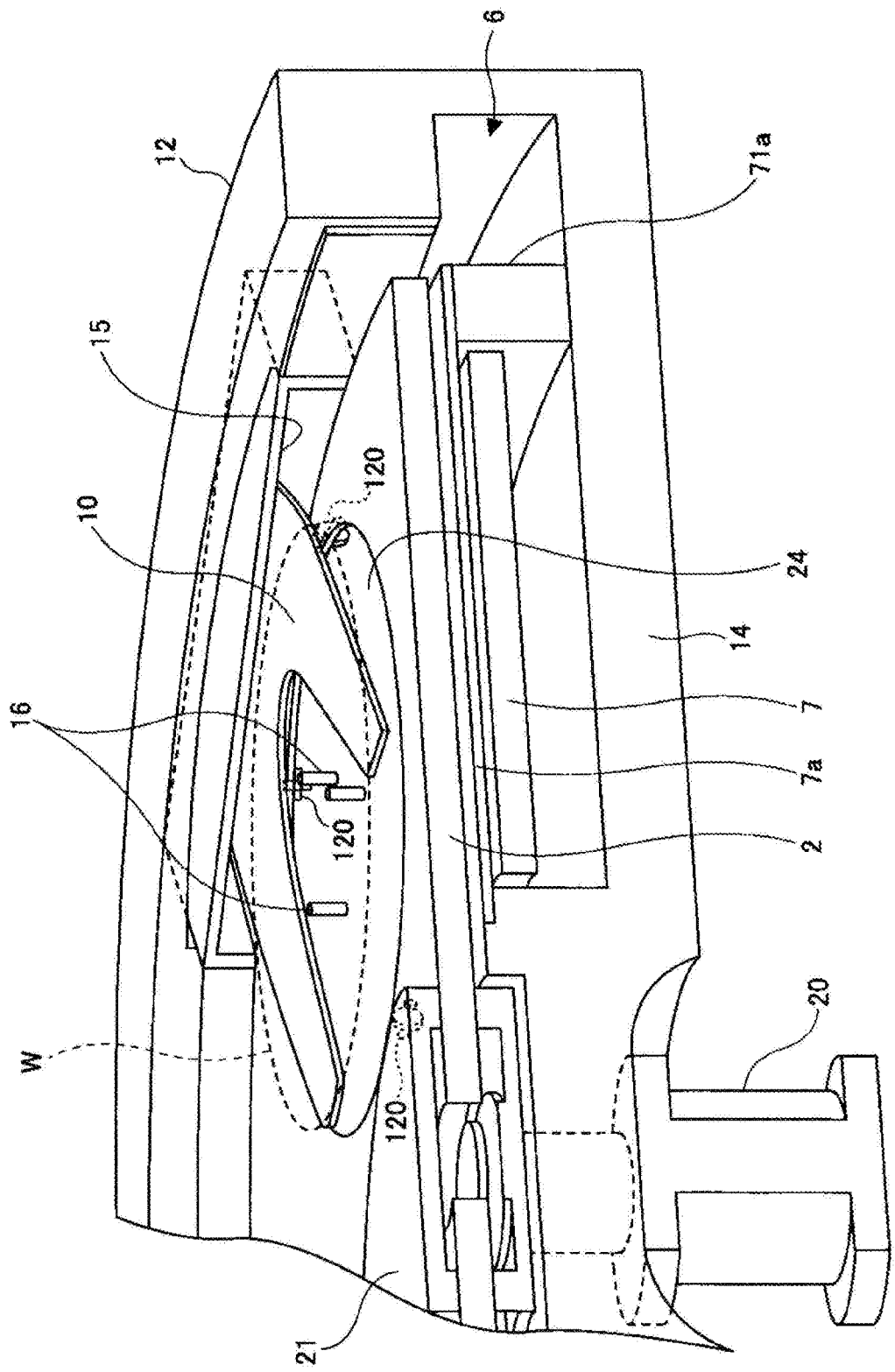
FIG. 7 is a cutaway perspective view of a portion of the film formation apparatus of FIG. 1.

Referring to FIGS. 2, 3 and 7, a transfer port 15 is formed in the peripheral wall of the container main body 12. The wafer W is loaded into or unloaded from the vacuum container 1 through the transfer port 15 by a transfer arm 10. The transfer port 15 is opened and closed by a gate valve (not shown) installed in the vicinity of the transfer port 15. In addition, three through-holes (not shown) are formed in a bottom surface of the recess 24 such that three lift pins 16 (see FIG. 7) move up and down through the respective through-holes. The lift pins 16 are configured to lift the wafer W up and down while supporting the lower surface of the wafer W so as to deliver the wafer W between the rotary table 2 and the transfer arm 10.

FIGS. 8A and 8B are views showing examples of a substrate holding mechanism according to another embodiment of the present disclosure. FIG. 8A is a view showing a state of the substrate holding mechanism according to another embodiment of the present disclosure, before the wafer W is mounted on the mounting portion 24. FIG. 8B is a view showing a state of the substrate holding mechanism according to another embodiment of the present disclosure after the wafer W is mounted on the mounting portion 24.

As shown in FIGS. 8A and 8B, each of the substrate holding mechanisms 120 according to this embodiment includes a substrate holding member 80, a rotary shaft 81, a connection member 82, a pressing member 83, a spring 90, a spring support member 91, a pushing pin 100, and a stopper 110.

As shown in FIGS. 8A and 8B, the substrate holding mechanisms 120 are installed in the vicinity of the outer periphery of the mounting portion 24. As shown in FIG. 8B, a substrate holding region 25 where the wafer W is securely held is defined in the mounting portion 24. The substrate holding mechanisms 120 are installed around the substrate holding region 25. In other words, the substrate holding region 25 is included in the mounting portion 24 and is provided such that the substrate holding mechanisms 120 securely hold the wafer W. The mounting portion 24 is formed to be concave downward from the upper surface of the rotary table 2. The substrate holding mechanisms 120 are installed outside and below the mounting portion 24.

The number of the substrate holding mechanisms 120 is not particularly limited. For example, as shown in FIGS. 2 and 3, a plurality of substrate holding mechanisms 120 may be installed. In terms of securely preventing floating up of the wafer W, at least three substrate holding mechanisms 120 may be installed.

The substrate holding member 80 is brought into contact with the wafer W to hold the wafer W in place. Thus, an inner surface of the substrate holding member 80 is defined as a contact surface at which the substrate holding member 80 is in contact with the wafer W. The rotary shaft 81 is a central shaft for rotatably supporting the substrate holding member 80 and is installed in a radial direction of the rotary table 2 such that the center of the rotary table 2 is connected to the periphery thereof. Thus, the substrate holding member 80 rotates inward of the substrate holding region 25 about the rotary shaft 81 so that the substrate holding member 80 is brought into contact with a lateral surface of the wafer W, thereby holding the wafer W. The substrate holding member 80 may be formed in various shapes as long as it has the contact surface 80a having a sufficient flatness or curvature to contact with the lateral surface of the wafer W, and a cutoff portion 80b having an angular aperture through which the wafer W can be held in a non-contact manner. Further, the substrate holding member 80 may have a shape and structure in which the substrate holding member 80 can be rotatably held by the rotary shaft 81.

The substrate holding member 80 may be made of various materials. In some embodiments, the substrate holding member 80 may be made of a material having low dust generation property and high heat resistance on ground that the substrate holding member 80 is exposed to a processing space within the vacuum container 1. As an example, the substrate holding member 80 may be made of quartz, like the rotary table 2, or made of a material having low dust generation property and high heat resistance, such as ceramics.

The connection member 82 is to connect the substrate holding member 80 to the spring 90. Each of the substrate holding mechanisms 120 according to this embodiment operates and releases the substrate holding member 80 by virtue of a biasing force of the spring 90. Thus, the connection member 82 configured to connect the substrate holding member 80 to the spring 90 is installed to transmit the biasing force of the spring 90 to the substrate holding member 80.

The pressing member 83 is a target (object to be pressed) of the pushing pin 100. The pressing member 83 is pushed by the pushing pin 100 so that a pressing force against the biasing force of the spring 90 is transmitted to the connection member 82. In other words, the pressing member 83 is connected to the spring 90 and the connection member 82 so that it usually receives the biasing force of the spring 90. However, if the pressing force against the biasing force of the spring 90 is applied to the pressing member 83, the pressing member 83 applies the pressing force in a direction opposite the direction of the biasing force of the spring 90.

Specifically, FIG. 8A shows a state where the pressing member 83 is receiving the upward pushing force of the pushing pin 100. As shown in FIG. 8A, the pressing member 83 is moved upward so that the connection member 82 connected to the pressing member 83 is also moved upward. The upward movement of the connection member 82 allows the substrate holding member 80 to be rotated outward, such that the contact surface 80a is opened. Thus, a condition in which the wafer W can be mounted on the mounting portion 24 is established.

In the state shown in FIG. 8A, an aperture angle α of the substrate holding member 80 with respect to a plane of the mounting portion 24 may be set to an angle at which the wafer W can be received in the substrate holding member 80, for example, at least about 90 degrees. Meanwhile, although the substrate holding member 80 can receive the wafer W even at any angle of about 90 degrees or more, since a higher-than-necessary angle may cause unnecessary waste of time rather than facilitating a process, the aperture angle α is set to about 90 degrees. Therefore, the aperture angle α of the substrate holding member 80 required for receiving the wafer W may be set to fall within a range of 80 to 95 degrees, and in some embodiments, about 90 degrees.

The spring 90 is to apply the biasing force to the substrate holding member 80 through the connection member 82. As shown in FIG. 8B, the spring 90 is contracted to generate a force for pulling the connection member 82 down. Then, the substrate holding member 80 connected to the connection member 82 is forced to rotate inwardly. As a result, the substrate holding member 80 applies a force for pushing the lateral surface of the wafer W toward the center of the rotary table 2, more specifically, a force for obliquely pushing the lateral surface of the wafer W. Thus, the wafer W is resiliently held by the force applied thereto so that the wafer W can be securely held in place without damaging the front surface of the wafer W.

The spring support member 91 is to support the spring 90. The spring support member 91 is installed under the spring 90 to support the spring 90 from below.

The spring 90 may be made of various materials, for example, ceramics. As described above, respective members inside the vacuum container 1 may be made of quartz or ceramics, which has low dust generation property and high heat resistance. However, quartz has a poor elasticity and is thus difficult to use as the material of the spring 90. Thus, the spring 90 may be made of, for example, ceramics.

In addition, the spring 90 may be variedly shaped depending on an intended usage. As an example, the spring 90 may be shaped in a plate spring type instead of a helical spring as shown in FIGS. 8A and 8B. The helical spring as shown in FIGS. 8A and 8B may cause contamination due to contact between respective lines of the spring 90. Thus, the use of the plate spring having a reduced number of parts is further desirable. With this in mind, the spring 90 may be formed as the plate spring.

As shown in FIG. 8B, when the connection member 82 is biased downward by the spring 90, the wafer W remains held by the substrate holding member 80. In other words, in a normal state, the spring 90 is operated to hold the wafer W. At this time, an aperture angle r of the contact surface 80a of the substrate holding member 80 may range, for example, from 70 to 85 degrees, in some embodiments, 75 to 80 degrees. In this way, by resiliently keeping the contact surface 80a of the substrate holding member 80 at the aperture angle β slightly inwardly inclined from a vertical line, the substrate holding member 80 can securely hold the wafer W while exposing the front surface of the wafer W. That is to say, if the aperture angle (3 of the contact surface 80a of the substrate holding member 80 is too close to 90 degrees, the force for holding the wafer W is relieved. On the contrary, if the aperture angle (3 of the contact surface 80a of the substrate holding member 80 is too small, the front surface of the wafer W is partially covered by the substrate holding member 80. As a result, the periphery of the wafer W may be insufficiently processed during the substrate process. Thus, in the substrate holding mechanism 120 according to this embodiment, the substrate holding member 80 applies the force with respect to the lateral surface of the wafer W, thereby securely holding the wafer W without affecting the substrate process.

The pushing pin 100 serves to release the holding of the wafer W by the substrate holding member 80. Specifically, when the biasing force generated by the contraction of the spring 90 is applied to the connection member 82 and the substrate holding member 80 is locked to hold the wafer W, the spring 90 is extended upward by virtue of the biasing force thereof to push the pressing member 83 upward, thus moving upward the connection member 82 connected to the pressing member 83. With the upward movement of the connection member 82, the substrate holding member 80 rotates outwardly so that the holding of the wafer W is released. In this configuration, the wafer W is ready to be moved upward with lifting up of the lift pins 16.

The stopper 110 used as a limiting part serves to limit an upward movement of the pressing member 83 when being pressed. Specifically, the stopper 110 is installed at a predetermined position above the pressing member 83 to set a limit of the upward movement of the pressing member 83. As shown in FIG. 8B, the stopper 110 is installed below the mounting portion 24 to limit the upward movement of the pressing member 83, thus preventing the pressing member 83 from being moved beyond the mounting portion 24. With this configuration, even when the substrate holding member 80 is released, it is possible to prevent the wafer W from floating up, which is caused when the pressing member 83 pushes the back surface of the wafer W. Thus, it is possible to maintain a state where the wafer W is held in the substrate holding region 25.

In addition, as shown in FIG. 8A, when the pushing pin 100 pushes the pressing member 83 from below and the pressing member 83 is thus moved upward, the stopper 110 is out of sight due to the pressing member 83 from a lateral side. This is because the stopper 110 is engaged with a groove formed in the pressing member 83. Thus, the pressing member 83 and the stopper 110 may be configured to be engaged with each other as above or to be fitted with each other. Alternatively, the pressing member 83 may be formed in a flat plate shape without having such an engaging or fitting structure.

An operation of the substrate holding mechanism 120 will be now described.

First, as shown in FIG. 8A, the lift pin 16 is moved up to receive the wafer W transferred from the transfer arm 10. Subsequently, the lift pin 16 is moved down to be brought into the state as shown in FIG. 8A. In this case, the pushing pin 100 pushes the pressing member 83 from below so that the pressing member 83 and the connection member 82 are moved up. And, the substrate holding member 80 connected to the outer end of the connection member 82 at the inner end thereof is outwardly rotated about the rotary shaft 81. Thus, the contact surface 80a of the substrate holding member 80 is opened. In this way, the wafer W is ready to be mounted on the mounting portion 24.

Thereafter, as shown in FIG. 8B, the lift pin 16 is moved below the mounting portion 24 and then the wafer W is mounted on the mounting portion 24. At this time, the pushing pin 100 is moved down. Thus, the contraction force of the spring 90 forces the pressing member 83 and the connection member 82 to be moved down. With the downward movement of the connection member 82, the substrate holding member 80 is inwardly rotated about the rotary shaft 81 so that the contact surface 80a of the substrate holding member 80 is brought into contact with the lateral surface of the wafer W while pushing the lateral surface of the wafer W. Since the biasing force of the spring 90 is always applied respect to the substrate holding member 80, the wafer W can be securely held in place in the substrate holding region 25, that is to say, on the mounting portion 24. With this configuration, even when the rotary table 2 is rotated to initiate the processing of the wafer W, the front surface of the wafer W is processed while keeping the contact state of the wafer W with the substrate holding region 25. Since the wafer W is held while being in contact with the substrate holding region 25, it is possible to prevent the back surface of the wafer W from being unnecessarily processed.

Upon completing of the processing of the wafer W, the pushing pin 100 pushes the pressing member 83 upward to release the substrate holding member 80. Since the upward movement of the pressing member 83 is limited by the stopper 110, the movement of the substrate holding member 80 is stopped at a predetermined position, for example, at a position at which the substrate holding member 80 is opened by about 90 degrees with respect to the plane of the mounting portion 24. Subsequently, as shown in FIG. 8A, the lift pin 16 is moved up to lift up the wafer W. Thereafter, the transfer arm 10 receives the processed wafer W from the lift pin 16 and transfers the same to the outside of the vacuum container 1.

As described above, according to the substrate holding mechanism 120 of this embodiment, it is possible to securely hold the wafer W while exposing the entire front surface of the wafer W, thus preventing the back surface of the wafer from being unnecessarily processed without affecting the front surface of the wafer W.

Figure 11:
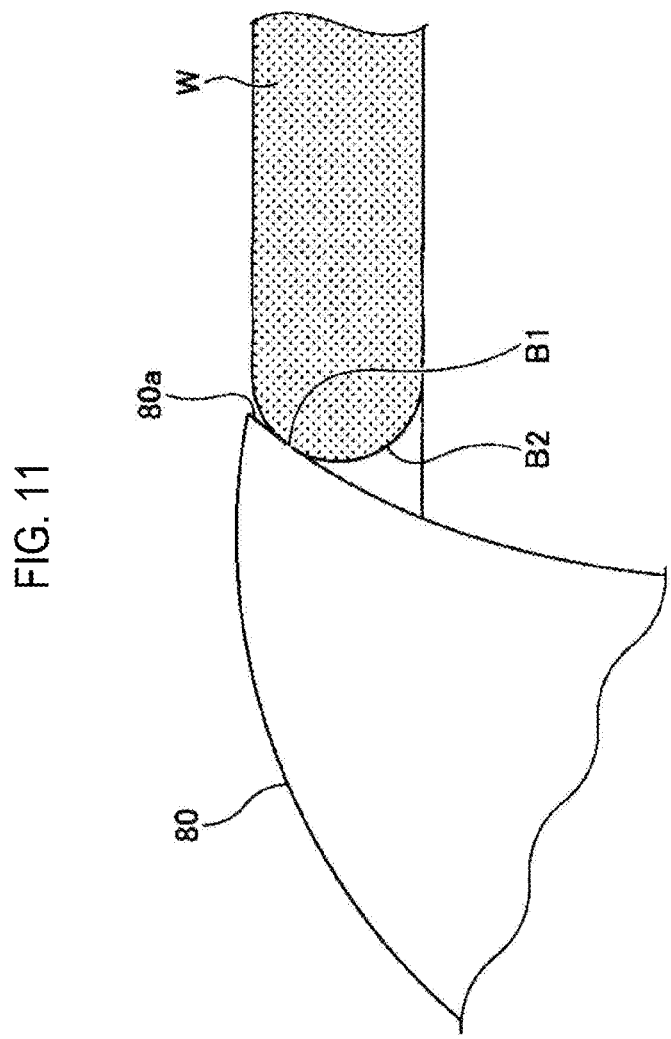
FIG. 11 is an enlarged view of the vertical cross-sectional outline of the contact surface of the substrate holding member in the substrate holding mechanism according to an embodiment of the present disclosure.

FIG. 9 is a view showing a horizontal plane outline of the contact surface 80a of the substrate holding member 80 of the substrate holding mechanism 120 according to the embodiment of the present disclosure. FIG. 11 shows an enlarged view of the substrate holding member 80 of the substrate holding mechanism 120. The contact surface 80a of the substrate holding member 80 may be shaped corresponding to a shape of the periphery of the wafer W. As an example, the contact surface 80a of the substrate holding member 80 may be concavely curved in the form of a circular arc to conform to the wafer W which has generally a circular shape. This increases a contact area between the periphery of the wafer W and the contact surface 80a, which makes it possible to more securely hold the wafer W in place.

Figure 10:
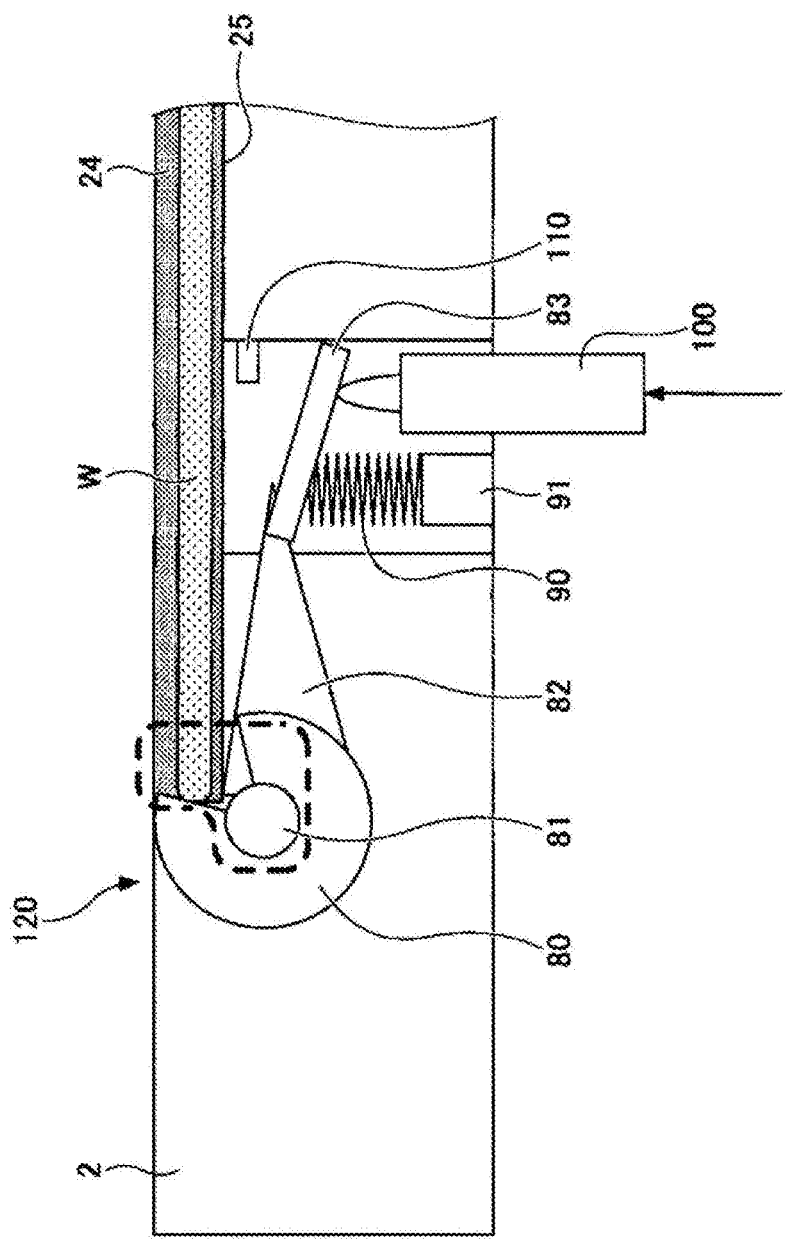
FIG. 10 is a vertical cross-sectional outline of the contact surface of the substrate holding member in the substrate holding mechanism according to an embodiment of the present disclosure.

FIG. 10 is a view showing a vertical cross-sectional outline of the contact surface 80a of the substrate holding member 80 of the substrate holding mechanism 120 according to the embodiment of the present disclosure. In FIG. 10, there is shown a state in which the contact surface 80a of the substrate holding member 80 is in contact with the lateral surface of the wafer W. In some embodiments, the contact surface 80a may be formed in a curved shape corresponding to a beveled shape of the wafer.

FIG. 11 shows an example in which a beveled portion is formed in the lateral surface of the wafer W and the contact surface 80a of the substrate holding member 80 is formed in an inwardly curved shape to meet a shape of the beveled portion. As shown in FIG. 11, the lateral surface of the wafer W has an upper beveled portion B1 and a lower beveled portion B2. The contact surface 80a of the substrate holding member 80 has a curved shape to meet a shape of the upper beveled portion B1. This configuration increases a contact area between the contact surface 80a of the substrate holding member 80 and the lateral surface of the wafer W, which makes it possible to more securely hold the wafer W in place.

As described above, the contact surface 80a of the substrate holding member 80 may be formed to correspond to a shape of the periphery of the wafer W either when viewed from a plane or a lateral side, as needed. This configuration makes it possible to further enhance a holding capability of the substrate holding mechanism 120.

In addition, as shown in FIG. 3, the film formation apparatus according to this embodiment includes a control part 150 configured to control the operation of the film formation apparatus as a whole. The control part 150 includes a process controller 150a equipped with, e.g., a computer, a user interface 150b, and a memory device 150c. The user interface 150b includes a display for displaying an operation status of the film formation apparatus, and a keyboard or a touch panel (not shown) through which an operator of the film formation apparatus selects a process recipe or a process administrator changes parameters of the process recipe, and the like. In addition, the control part 150 may control the holding operation of the substrate holding mechanism 120.

The memory device 150c stores a control program for controlling the process controller 150a to execute various processes, process recipes, parameters of the various processes, and the like. In addition, among these programs, there is a program to store, for example, a series of steps for performing a cleaning process to be described below. The control program and the process recipes are executed by being read by the process controller 150a according to instructions from the user interface 150b. In addition, these programs may be stored in a computer-readable storage medium 150d and then installed in the memory device 150c through a respective input/output device (not shown). The computer-readable storage medium 150d may include a hard disc, CD, CD-R/RW, DVD-R/RW, a flexible disc, a semiconductor memory or the like. Alternatively, these programs may be downloaded to the memory device 150c through a communication line.

Next, one example of the operation of the film formation apparatus (film formation process) according to this embodiment will be described. First, the rotary table 2 is rotated such that the mounting portion 24 is aligned with the transfer port 15 and then, the gate valve (not shown) is opened.

Subsequently, the wafer W is loaded into the vacuum container 1 through the transfer port 15 by the transfer arm 10. The wafer W is delivered on the lift pins 16 and then the transfer arm 10 is retracted from the vacuum container 1. Thereafter, the wafer W is moved to the mounting portion 24 by the lift pins 16 with an operation of a lifting mechanism (not shown). Subsequently, as described with reference to FIGS. 8A and 8B, the wafer W mounted on the mounting portion 24 is held by the substrate holding mechanism 120. A sequence of the aforementioned processes is repeated five times so that five sheets of wafers W are mounted on the respective recesses 24.

Subsequently, the vacuum container 1 is maintained at a predetermined pressure by the vacuum pump 64 and the pressure regulator 65. The rotary table 2 begins to rotate in the clockwise direction when viewed from the top. The rotary table 2 has been heated in advance to a predetermined temperature (for example, 300 degrees C.) by the heater unit 7. Thus, the wafers W mounted on the rotary table 2 are also heated. Whether or not a temperature of the heated wafer W reaches to the predetermined temperature is measured by a temperature sensor (not shown). If the result of the measurement is positive, the BTBAS gas is supplied into the first process region P1 through the process gas nozzle 31, and the $O_3$ gas is supplied into the second process region P2 through the process gas nozzle 32. In addition, the $N_2$ gas is supplied from each of the separation gas nozzles 41 and 42. Further, the $N_2$ gas is discharged from the central region C, that is to say, the space between the protrusion 5 and the rotary table 2, along the surface of the rotary table 2. Moreover, the $N_2$ gas is also supplied from the separation gas supply pipe 51 and the purge gas supply pipes 72 and 73.

When the wafer W passes through the first process region P1 under the process gas nozzle 31, BTBAS molecules are adsorbed onto the front surface of the wafer W. Subsequently, when the wafer W passes through the second process region P2 under the process gas nozzle 32, $O_3$ molecules are adsorbed onto the front surface of the wafer W. Thus, the BTBAS molecules are oxidized by the $O_3$ molecules. In this way, once the wafer W passes through both the process regions P1 and P2 one time with the rotation of the rotary table 2, a layer of silicon oxide molecules (or two or more layers of silicon oxide molecules) is formed on the front surface of the wafer W. Thereafter, the wafer W alternately passes through the process regions P1 and P2 multiple times so that a silicon oxide film having a predetermined thickness is deposited on the front surface of the wafer W. During that time, the wafer W is held in place by the substrate holding mechanism 120 without floating up from the mounting portion 24, thus preventing an unwanted film form being formed on the back surface of the wafer. In addition, since the front surface of the wafer W remains entirely exposed, it is possible to perform a uniform film formation process on the front surface of the wafer W. Once the silicon oxide film having a predetermined thickness is deposited on the front surface of the wafer, the BTBAS gas and the $O_3$ gas are no longer supplied and the rotation of the rotary table 2 is stopped. Subsequently, the processed wafers W are sequentially unloaded from the vacuum container 1 by the transfer arm 10 in reverse order of the loading operation. In this way, the film formation process is ended. Here, the unloading operation of the wafer W is the same as described with reference to FIGS. 8A and 8B.

While in this embodiment, the substrate holding mechanism 120 has been described to be applied to the substrate processing apparatus using the rotary table 2, the substrate holding mechanism 120 according to this embodiment may be applied to a substrate processing apparatus using a susceptor configured to hold the wafers W without rotating the wafers W.

According to the present disclosure in some embodiments, it is possible to securely hold a wafer while exposing the entire front surface of the wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate holding mechanism for holding a substrate in a predetermined substrate holding region on a susceptor, comprising:
   a substrate holding member having a predetermined contact surface, installed around the predetermined substrate holding region, and forming a first aperture angle of the predetermined contact surface with respect to a plane of the predetermined substrate holding region, and configured to be in contact with a lateral surface of the substrate mounted on the predetermined substrate holding region at the predetermined contact surface of the substrate holding member when the substrate holding member is rotated inward of the predetermined substrate holding region forming a second aperture angle, which is smaller than the first aperture angle, of the predetermined contact surface with respect to the plane of the predetermined substrate holding region;
   a connection member connected to the substrate holding member;
   a biasing part configured to apply a biasing force to the substrate holding member through the connection member such that the substrate holding member is brought into contact with the lateral surface of the substrate to hold the substrate;
   a pressing member connected to the connection member;
   a release member configured to apply a pressing force by pushing the pressing member against the biasing force of the biasing part to the substrate holding member via the connection member such that the substrate holding member is released to lift up the substrate in a vertical direction in a state where the predetermined contact surface of the substrate holding member is opened by approximately 90 degrees with respect to the plane of the predetermined substrate holding region; and
   a limiting part configured to limit a movement range of the pressing member which moves with the pressing force of the release member to limit the first aperture angle of the substrate holding member,
   wherein the second aperture angle ranges from 70 to 85 degrees, when the substrate is held by the substrate holding member, and
   wherein the biasing part is a spring, and the biasing force is a contraction force of the spring.

2. The substrate holding mechanism of claim 1, wherein the substrate holding member is installed outside an outer periphery of the predetermined substrate holding region and is supported by a rotary shaft which is rotatable in a radial direction of the predetermined substrate holding region.

3. The substrate holding mechanism of claim 1, wherein the connection member, the pressing member and the biasing part are installed below the predetermined substrate holding region.

4. The substrate holding mechanism of claim 3, wherein the release member is a lifting member configured to push the pressing member from below.

5. The substrate holding mechanism of claim 1, wherein the spring is made of a ceramic material.

6. The substrate holding mechanism of claim 1, wherein the spring is a plate spring.

7. The substrate holding mechanism of claim 1, wherein the predetermined contact surface of the substrate holding member is formed to correspond to a shape of an outer periphery of the substrate in a horizontal plan view.

8. The substrate holding mechanism of claim 1, wherein the predetermined contact surface of the substrate holding member is formed in an upwardly convex curved shape, as viewed in a vertical section.

9. The substrate holding mechanism of claim 1, wherein the predetermined contact surface of the substrate holding member is brought into contact with a beveled surface formed in the lateral surface of the substrate.

10. The substrate holding mechanism of claim 1, wherein the substrate holding member, the biasing part and the release member are installed in multiple places around the periphery of the predetermined substrate holding region, respectively.

11. The substrate holding mechanism of claim 10, wherein the substrate holding member, the biasing part and the release member are installed in at least three places around the periphery of the predetermined substrate holding region, respectively.

12. The substrate holding mechanism of claim 1, wherein the predetermined substrate holding region is formed within a predetermined substrate mounting region which is downwardly concave from a surface of the susceptor.

13. A substrate processing apparatus, comprising:
the substrate holding mechanism of claim 12;
a process container configured to receive the susceptor in the process container;
at least three through-holes formed to pass through the predetermined substrate holding region;
a plurality of lift pins installed to move up and down through the through-holes, respectively; and
a transfer arm configured to transfer the substrate between the plurality of lift pins and outside of the process container,
wherein the release member is driven independently of the plurality of lift pins.

14. The substrate processing apparatus of claim 13, wherein the susceptor is configured as a rotatable table, and a plurality of substrate loading regions is formed in multiple places in a rotational direction of the rotatable table,
the substrate processing apparatus further comprising;
first and second process regions formed to be spaced apart from each other in the rotational direction of the rotatable table and to which first and second processing gases are supplied, respectively; and
a separation region formed between the first and second process regions in the rotational direction of the rotatable table and to which a separation gas for separating the first and second process gases from each other is supplied.

* * * * *